United States Patent [19]

Levesque

[11] Patent Number: 5,422,608

[45] Date of Patent: Jun. 6, 1995

[54] ADAPTIVE TRANSMISSION LINE TERMINATION

[75] Inventor: Louis Y. Levesque, Salem, N.H.

[73] Assignee: Texas Instruments Incorporated, Dallas, Tex.

[21] Appl. No.: 298,235

[22] Filed: Aug. 30, 1994

Related U.S. Application Data

[63] Continuation of Ser. No. 176,982, Jan. 3, 1994, abandoned, which is a continuation of Ser. No. 950,375, Sep. 23, 1992, abandoned.

[51] Int. Cl.[6] .......................................... H03H 11/30
[52] U.S. Cl. .................... 333/17.3; 333/22 R; 327/77
[58] Field of Search ............... 333/17.3, 22 R, 32, 333/33, 81 R, 81 A; 307/359, 362, 443, 490, 491

[56] References Cited

U.S. PATENT DOCUMENTS

| | | | |
|---|---|---|---|
| 4,859,877 | 8/1989 | Cooperman et al. | 307/443 |
| 4,937,466 | 6/1990 | Osterkamp et al. | 333/81 R |
| 4,943,739 | 7/1990 | Slaughter | 333/22 R X |
| 5,111,080 | 5/1992 | Mizukami et al. | 333/32 X |
| 5,164,663 | 11/1992 | Alcorn | 333/22 R X |
| 5,227,677 | 7/1993 | Furman | 307/443 |

*Primary Examiner*—Paul Gensler
*Attorney, Agent, or Firm*—Bobby T. Holland; Wade James Brady, II; Richard L. Donaldson

[57] ABSTRACT

An adaptive transmission line termination which includes a variable voltage controlled resistor (16) connected either in series with the sending end of transmission line (10) or in parallel with the receiving end of line (10). The resistance of resistor (16) is varied in dependence upon the half voltage appearing on line (10) in order to match the characteristic impedance of line (10) for the series or source termination case. In the parallel termination case, the resistance of resistor (34) is varied in dependence upon the voltage appearing at the input of gate (14) to match the characteristic impedance of line (10).

20 Claims, 2 Drawing Sheets

ADAPTIVE TRANSMISSION LINE TERMINATION

This application is a continuation of application Ser. No. 08/176,982, filed Jan. 3, 1994, now abandoned which is a continuation of application Ser. No. 07/950,375, filed Sep. 23, 1992, now abandoned.

TECHNICAL FIELD OF THE INVENTION

This application relates to a transmission line termination, and more particularly relates to a system and method for adaptively matching a transmission line termination with the characteristic impedance of the transmission line.

BACKGROUND OF THE INVENTION

It is common to provide a specified resistance at the termination of a transmission line in order to reduce reflections at the sending end or the receiving end of the transmission line. For example, termination resistors are used to eliminate reflections between buffers which interface with communication lines such as Sonet/ATM lines, at STS3 (155 Mbytes/sec) or STS12 (622 Mbytes/sec) transmission rates. Such resistive terminations have also heretofore been used to reduce reflections on other types of high performance electronic circuits such as gallium arsenide circuits, radar and other synchronous circuitry.

In the past, the value of the fixed resistance attached to either the sending or receiving end of a transmission line has been chosen to add to the output impedance of the associated driving gate, such that the sum of the fixed resistor and the driving gate output impedance is essentially equal to the characteristic impedance of the transmission line. However, the value of the fixed resistance is normally chosen based upon the average distribution of values for the driving gate resistance and the characteristic impedance of the line, both of which can vary greatly. Reflections and ringing on the lines thus commonly occur, which reduces noise margin. The value of the output impedance of the driving gate, for example, can vary with various DC currents which flow through the output driving transistor. Further, often the output impedance for a logic one or zero are not symmetrical, and circuit designers must rely upon the geometric mean of the output impedance of the driving gate.

This is particularly the case for BiCMOS circuits which provide TTL interface. The logic one output impedance is usually twice as high as the CMOS interface circuits in BiCMOS, as an additional diode drop is often used to obtain the proper TTL output level. Further, present day manufacturing capabilities for controlled impedance strip lines, for instance, may have a tolerance as high as ±20%, thus making it difficult to determine the desired resistance for the termination resistance. Moreover, loading resulting from elements such as connectors, printed circuit board vias, test pads, bond wires, integrated circuit fanout patterns and package parasitics are also variable, which again presents difficulties when attempting to choose the desired impedance for the termination resistor.

A need has thus arisen for an adaptive termination for transmission lines for use at either the sending or receiving end of the transmission line, such that changes in impedance of the transmission line are automatically compensated for, and wherein manufacturing tolerances and the like may be automatically compensated for. Specifically, a need has arisen for a technique to automatically match the overall interconnection system characteristic impedance of a transmission circuit to reduce or eliminate reflection at either the sending or receiving end of the transmission line.

SUMMARY OF THE INVENTION

In accordance with the present invention, a system and method are provided which eliminate or substantially reduce the deficiencies associated with previously developed transmission line termination techniques.

In accordance with the present invention, an adaptive transmission line termination includes a driving gate connected to the transmission line which has a prescribed output impedance. A voltage controlled resistive element is coupled at the output of the driving gate. The resistance of the resistive element is variable in response to the voltage appearing on the transmission line in order to match the overall characteristic impedance of the transmission line. The resistive element may be coupled in series with the transmission line at the sending end, or alternatively may be connected in parallel to the transmission line at the receiving end.

In accordance with another aspect of the invention, an adaptive termination for a transmission line includes a variable resistor coupled to the transmission line. A voltage sensor senses the voltage on the transmission line and generates a control signal dependent upon the voltage on the transmission line. The variable resistor is dependent upon the control signal to vary the impedance of the termination to match the overall impedance of the transmission line. In one embodiment, the variable resistor may comprise a field effect transistor.

In accordance with yet another aspect of the invention, a method of terminating a transmission line includes coupling a variable transistor to the transmission line. Voltage on the transmission line is sensed and an error signal is generated in dependence upon variance of the voltage on the transmission line. The error signal is applied to the variable resistor to vary the impedance of the termination to match the overall characteristic impedance of the transmission line.

BRIEF DESCRIPTION OF THE DRAWINGS

For a more complete understanding of the present invention and for other advantages and objects thereof, reference is now made to the following description taken in conjunction with the following drawings.

DETAILED DESCRIPTION OF THE INVENTION

Figure 1:
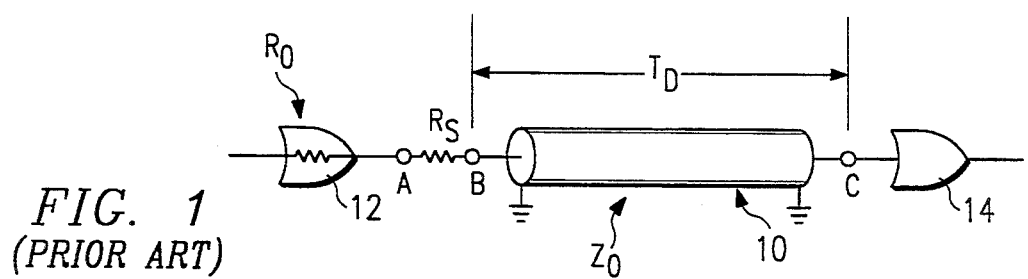
FIG. 1 illustrates a schematic illustration of a prior art series terminated line using a fixed resistance.

FIG. 1 is a schematic illustration of a prior art transmission line termination at the sending end of a transmission line 10. The illustrated series termination tends to eliminate reflections at the sending end of the transmission line 10. The series termination is achieved by connecting a resistor $R_S$ in series between the output of a driving gate 12 and the transmission line 10. The output of the transmission line 10 is connected to a conventional output driver 14. In order to reduce reflections, the sum of $R_S$ and the output impedance of the gate 12, termed $R_O$, is made equal to the characteristic impedance $Z_O$ of the transmission line 10.

In the prior art circuitry shown in FIG. 1, $R_S$ is generally chosen based upon the average distribution of values for the driving gate resistance $R_O$ and the characteristic impedance of the transmission line 10. As previously noted, the value of $R_O$ and $Z_O$ can vary greatly, and thus often cause increased reflections and ringing on the transmission line, which reduces noise margin. $R_o$, for instance, will vary with various DC currents flowing through output transistors and often the output impedance for a logic one or zero are not symmetrical.

Figure 2:
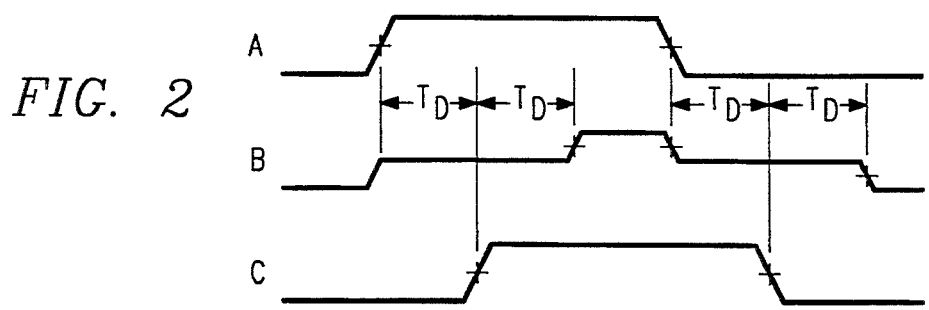
FIG. 2 is a graph illustrating the propagation of signal voltages on the series terminated line of FIG. 1.

FIG. 2 is a graphical illustration of the propagation of signal voltages on the circuit of FIG. 1. Waveform 2A represents the signal appearing between driving gate 12 and $R_S$. Waveform 2B comprises the signal appearing between $R_S$ and the transmission line 10. Waveform 2C comprises the signal appearing between the output of line 10 and gate 14.

The signal of FIG. 2B will propagate down the line and will appear as a signal 2C at some time $T_D$ later, where the voltage will double as a result of the unity reflection coefficient at the end of the transmission line 10. At time $2T_D$, the reflected voltage of FIG. 2C will again reach the configuration of FIG. 2B. Then this signal will fully be absorbed at the source, since it is automatically adjusted to the characteristic impedance of the line.

Figure 3:
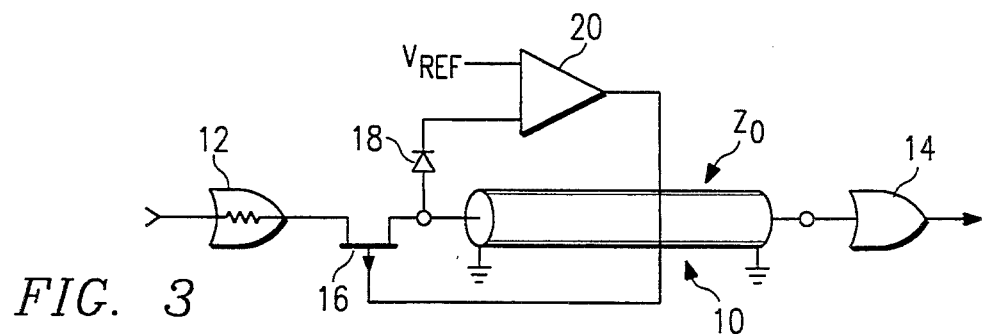
FIG. 3 is a block diagram of the adaptive sending end transmission line termination of the invention.

FIG. 3 illustrates a preferred embodiment of the present invention for providing automatic matching of the overall interconnection system characteristic impedance, such that reflections are eliminated or reduced even upon variances of $R_O$ or $Z_O$. The present invention includes previously described driving gate 12 and includes a field effect transistor (FET) 16 connected between the output of gate 12 and the input of transmission line 10. The FET 16 is connected as a variable resistor to replace the previously illustrated $R_S$. As the voltage on the gate of the FET 16 is increased, the FET resistance is increased, thereby increasing the source resistance and vice versa. The variable resistance qualities of the junction FET 16 make it an ideal component to use as a variable element, because when the FET gate is biased below pinch-off, the drain to source resistance will behave in a linear fashion.

Although FET's are described with respect to the variable voltage control resistor for use within the invention, it will be understood that other voltage control resistors such as a pin diode, an NMOS transistor, a PMOS transistor, a transmission gate or the like, may alternatively be used. Such devices should have good linearity when used for linear applications.

The source of the FET 16 is connected through a diode 18 to the input of a DC amplifier 20. A reference voltage is applied to the second input of amplifier 20. The output of the amplifier 20 is connected to the gate of the FET transistor 16. The drain to source resistance Rds of the FET 16 is directly related to the gate voltage applied to the FET by the amplifier 20. Rds can be approximated by:

$$Rds = Rdso \otimes \frac{Vp}{Vp - Vgs}$$

Where:
Vp=Pinch-off voltage
Vgs=Gate to source voltage
Rdso=Drain to source resistance with no gate voltage applied.

In operation of the device, a peak detector circuit formed by the detector 18 and by other associated circuitry detects the half voltage variations at the input of the transmission line 10. The reference voltage applied to amplifier 20 is chosen such that the output of amplifier 20 controls the gate of the FET 16 to automatically vary the resistance provided by FET 16 to compensate and adjust to the characteristic impedance of the transmission line 10.

When the transmission line 10 is long compared to the rise time of the signal wave applied, the source impedance of the compensating circuitry is automatically made equal to the characteristic impedance of the transmission line, and the voltage change at the input to the transmission line 10 is half the source voltage. When the transmission line is short compared to the rise time of the signal wave, there will be no half voltage reflections and the signals at the sending and receiving ends of line 10 are identical. In this case, the reflecting signals will be masked during the rise time and will not cause degradation of the signal. In such case, high frequency interconnection techniques are not required and the automatic termination is not required at the output of the driving gate 12. In this case, the resistance of FET 16 will be adjusted to approximately its mid range resistance, thus providing improved noise performance.

The present circuit will thus automatically adjust the output impedance of the driving gate 12 to the characteristic impedance of the interconnection system, even when the tolerance of the impedance of the transmission line, connector or backplane are at their extremes. The present circuit is useful to terminate transmission lines for any logic family such as TTL, CMOS, ECL, GaAs circuits, and linear output circuits. The circuit may also be used to eliminate or reduce to an acceptable level reflection from lines or wires which do not have controlled impedances. The technique of the present invention may be used at many circumstances where termination or damping is required to maintain signal integrity.

Figure 4:
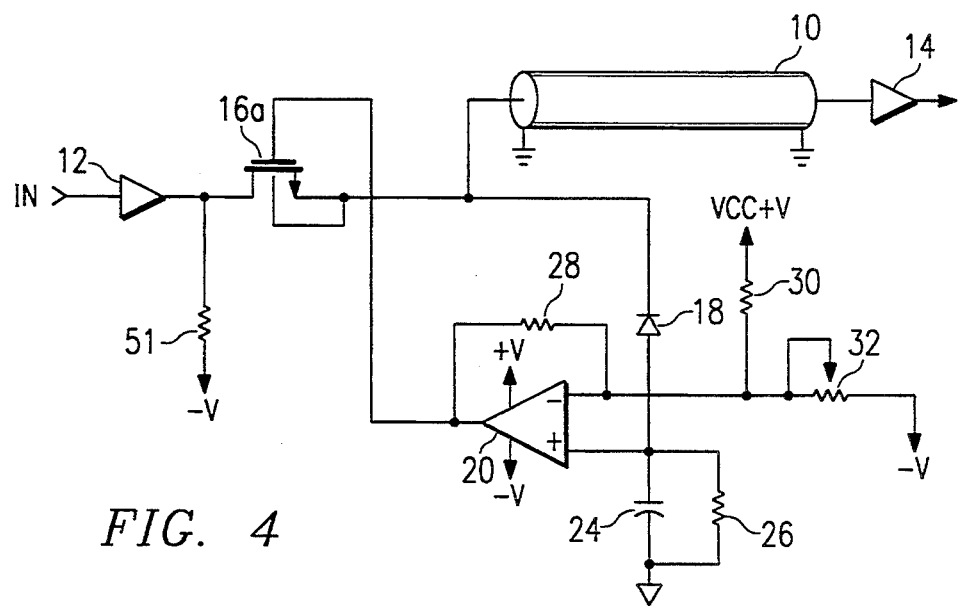
FIG. 4 is a schematic diagram of the adaptive transmission line termination of FIG. 3.

FIG. 4 is a schematic diagram of the circuit of FIG. 3, for ECL application, with like reference numerals being used for like and corresponding parts. The driving gate 12 is connected to a FET 16a. The source and drain of FET 16a is connected to the output of the gate 12 and the input of transmission line 10. The gate of FET 16a is connected to the output of a DC amplifier 20. The source of FET 16a is connected through diode 18 to the plus input of amplifier 20. Diode 18 is also connected to a parallel connected capacitor 24 and resistor 26. A resistor 28 is connected across the output of amplifier 20 and the minus input thereof. The minus input of amplifier 20 is further connected to VCC through a resistor 30 and through a variable resistance 32 to a minus voltage. The output of transmission line 10 is connected through the output driver 14 as previously illustrated.

It will be understood that any suitable variable resistor may be used with the invention, and that the illustrated FET transistors may be implemented in integrated circuitry in PMOS, NMOS or the like.

Although it is understood that the components of the present invention may widely vary, the following table illustrates component values which have been found to work well with a 50 Ohm RG174 transmission line:
Capacitor 24–0.001 uF
Resistor 26–4.7 Kohms
Resistor 28–10 Kohms
Resistor 30–1 Kohms
Resistor 32–20 Kohms
Resistor 51–275 Ohms In operation, the combination of resistors 30 and 32 provide the half voltage reference required at the negative input of the operational amplifier 20. Diode 18 and the RC combination of resistor 26 and capacitor 24 form a peak detector circuit which is used to detect the half voltage variations at the input of the transmission line 10. Resistor 28 sets the gain of the amplifier 20.

The value of the voltage controlled resistor 16a is controlled by the output voltage applied to the NMOS FET gates. As the voltage applied to the gates is increased, the FET resistance is decreased, thereby increasing the source resistance and vice versa. The system thus automatically compensates for and adjusts to the characteristic impedance of transmission line 10. The present invention is particularly adaptable to reduce transmission line reflections for high frequency transmission line designs for PC boards, such as 75 Mhz or higher. The present invention is also useful for buffers for integrated circuits, where it provides the termination directly at source or receiving end where it is most effective.

Figure 5:
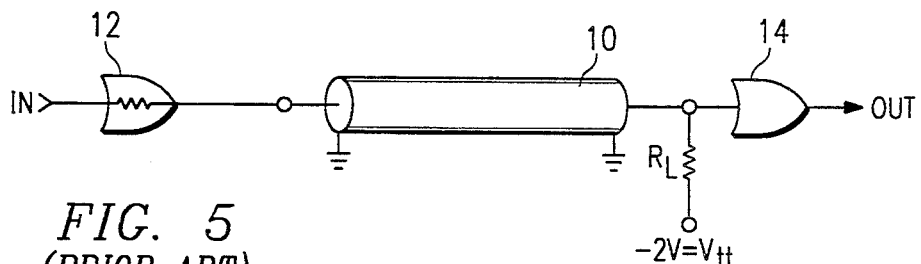
FIG. 5 is a schematic illustration of a prior art parallel transmission line termination.

FIG. 5 illustrates a prior art configuration for transmission line termination at the receiving end of a transmission line, with like numerals being used for like and corresponding parts. Gate 12 applies input signals to a transmission line 10. Parallel termination at the receiving end of the transmission line 10 is achieved by connecting a terminating resistor $R_L$ with the receiver gate 14. A match is obtained when the value of resistor $R_L$ is made equal to the characteristic impedance of the transmission line 10, thus providing a reflection coefficient of zero and no reflections. However, as noted, in practice there are many factors which will cause the components of the interconnection system to vary and thus cause increased reflections and ringing on the transmission line, thus decreasing the noise margin. The present invention will greatly reduce these effects since it automatically matches the overall interconnection system characteristic impedance at the receiving end.

Figure 6:
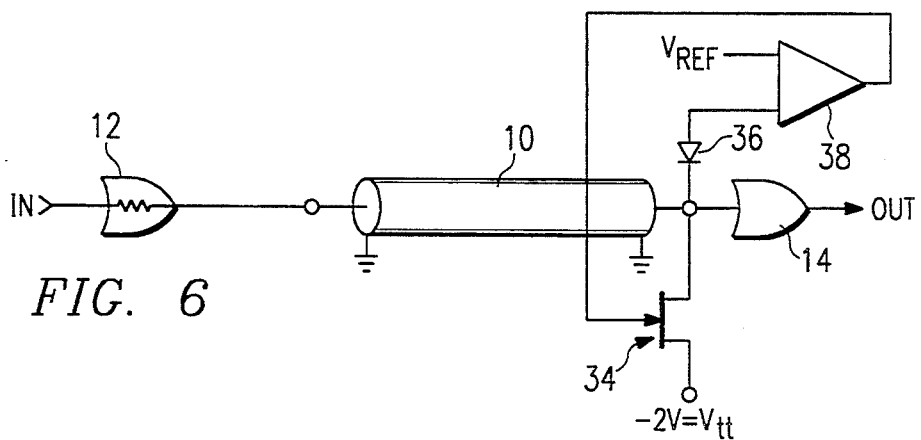
FIG. 6 is a block diagram of the receiving end adaptive transmission line termination of the invention.

FIG. 6 is a diagram of the receiving end circuitry of the invention. Input signals are applied from the driving gate 12 to the transmission line 10. A FET 34 is connected to replace the prior resistance $R_L$ in parallel with the receiving gate 14. The output of transmission line 10 is applied through a diode 36 to an input of an operational amplifier 38. The second input of the operational amplifier 38 is a reference voltage, with the output of the amplifier 38 being applied to the gate of the FET 34. As previously discussed, the FET 34 operates as a variable voltage control resistor.

Figure 7:
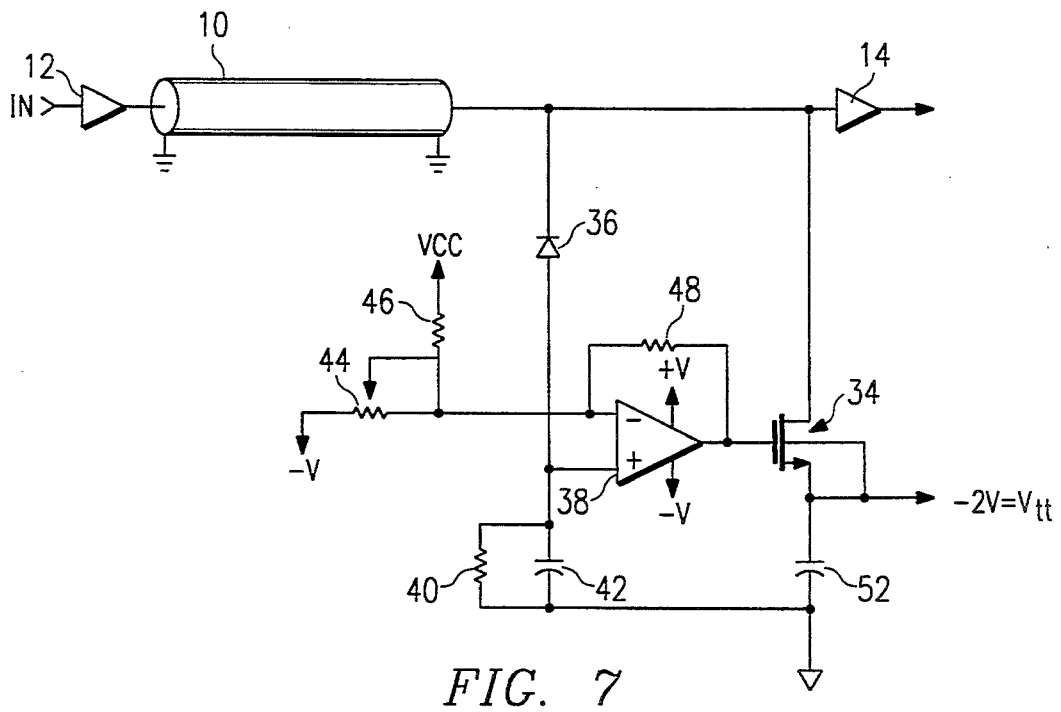
FIG. 7 is a schematic diagram of the adaptive transmission line termination of FIG. 6.

A schematic diagram of a preferred embodiment of the circuit shown in FIG. 6 is shown in FIG. 7, with like numbers being used for like and corresponding elements. Diode 36 is connected to the output of transmission line 10 and connected at its anode to the positive gate of the operational amplifier 38. An RC circuit comprising a resistor 40 and capacitor 42 are connected between the positive input of amplifier 38 and circuit ground. Resistor 44 and 46 are connected in parallel to the negative input of amplifier 38. Resistor 48 is connected across the negative input of amplifier 38 and the output thereof. The output of amplifier 38 is applied to the gate of FET 34. The source of transistor 34 is applied through a capacitor 52 to circuit ground. The drain of transistor 34 is connected to the input of the output gate 14. Although it will be understood that various components may be utilized by the present invention for various uses, the following sets forth component values of the circuit shown in FIG. 7 which have been found to provide good results when used with a 50 Ohm RG174 transmission line:
Resistor 44–20 Kohms
Resistor 46–1 Kohms
Resistor 40–4.7 Kohms
Capacitor 42–0.01 uF
Resistor 48–10 Kohms
Capacitor 52–0.001 uF The resistors 44 and 46 provide the reference voltage required at the negative input of the operational amplifier 38. Diode 36, resistor 40 and capacitor 42 serve to form a peak detector circuit which is used to detect the voltage variations at the receiver input. The resistor 48 sets the gain of the amplifier 38. The value of the resistance of FET 34 is controlled by the output voltage of amplifier 38 applied to the gate of FET 34. As the voltage on the gate of the FET 34's increase, the FET resistance is decreased and vice versa.

When the transmission line is long compared to the rise time of the signal input signal wave, the load impedance or resistance of the FET is automatically made equal to the characteristic impedance of the transmission line, thus eliminating reflections at the end of the transmission line 10. When the transmission line is short compared to the rise time of the signal wave, there are no reflections and the signal at source and load are essentially identical. The voltage control resistance of the FET 34 is thus adjusted to approximately its mid range resistance, thus providing improved noise performance in this condition.

Although the present invention has been described in detail, it should be understood that various changes, substitutions and alterations can be made without departing from the spirit and scope of the invention as defined solely by the appended claims.

What is claimed is:

1. A self adaptive transmission line termination comprising:
    a driving gate connected to a transmission line input having a prescribed output impedance; and
    a voltage controlled self adaptive resistive element coupled at the output of said driving gate, the resistance of said self adaptive resistive element being varied in response to the voltage appearing on the transmission line in order to match the overall characteristic impedance of the transmission line.

2. The adaptive transmission line termination of claim 1 wherein said resistive element is connected in series with the transmission line at the sending end of the transmission line.

3. The adaptive transmission line termination of claim 1 wherein said resistive element is connected in parallel at the receiving end of the transmission line.

4. The adaptive transmission line termination of claim 1 wherein said resistive element comprises a transistor.

5. The adaptive transmission line termination of claim 4 wherein said transistor comprises a field effect transistor.

6. The adaptive transmission line termination of claim 1 and further comprising an amplifier, having its input connected to the transmission line and its output connected to control said resistive element.

7. The adaptive transmissions line termination of claim 6 and further comprising detection circuitry connected between the transmission line and the input of said amplifier, said detection circuitry detecting half voltage variations on the transmission line.

8. A self adaptive transmission line termination comprising:
   a variable resistor coupled to a transmission line; and
   a voltage sensor for sensing the voltage on the transmission line and for generating a continuous control signal depending upon the voltage on the transmission line, said variable resistor dependent upon said continuous control signal to constantly vary the impedance of the termination to match the overall impedance of the transmission line.

9. The adaptive transmission line termination of claim 8 wherein said variable resistor comprises a field effect transistor.

10. The adaptive transmission line termination of claim 8 wherein said variable resistor is connected in series with the sending end of the transmission line.

11. The adaptive transmission line termination of claim 8 wherein said variable resistor is connected in parallel with the receiving end of the transmission line.

12. The adaptive transmission line termination of claim 8 and further comprising an amplifier having its input connected to the transmission line and its output connected to control said resistor.

13. The adaptive transmission line termination of claim 12 and further comprising detection circuitry connected between the transmission line and the input of said amplifier, said detection circuitry detecting half voltage variations on the transmission line.

14. The adaptive transmission line termination of claim 13 wherein said detection circuitry comprises:
   a peak detector circuit whose output is connected to the input of said amplifier.

15. The adaptive transmission line termination of claim 9 wherein said control signal is applied to the gate of said field effect transistor to control the source resistance thereof.

16. The adaptive transmission line termination of claim 15 wherein the gate of said field effect transistor is biased below pinch-off, such that the source resistance of said field effect transistor is linearly variable.

17. A method of self adaptively varying impedance of a transmission line termination comprising:
   constantly sensing the voltage on a transmission line;
   constantly comparing the sensed voltage with a reference voltage level and generating a control signal in response to variances of the sensed voltage; and
   constantly varying the magnitude of a resistor coupled to the transmission line in response to said control signal, such that the resistor matches the overall impedance of the transmission line.

18. The method of adaptively varying the impedance of a transmission line termination of claim 17 and further comprising applying said control signal to the gate of a field effect transistor to vary the resistance thereof.

19. The method of adaptively varying the impedance of a transmission line termination of claim 17 and further comprising coupling the resistor in series to the sending end of the transmission line.

20. The method of adaptively varying the impedance of a transmission line termination of claim 17 and further comprising coupling the resistor in parallel to the receiving end of the transmission line.

* * * * *